United States Patent
Chang et al.

(10) Patent No.: US 11,805,612 B2
(45) Date of Patent: *Oct. 31, 2023

(54) DEVICE HAVING FOOL-PROOFING STRUCTURE

(71) Applicant: Delta Electronics, Inc., Taoyuan (TW)

(72) Inventors: Ching-Tang Chang, Taoyuan (TW); Chi-Shou Ho, Taoyuan (TW); Chen-Chiang Su, Taoyuan (TW); Guan-Chen Yin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/094,264

(22) Filed: Jan. 6, 2023

(65) Prior Publication Data

US 2023/0232555 A1    Jul. 20, 2023

Related U.S. Application Data

(63) Continuation of application No. 17/503,588, filed on Oct. 18, 2021, now Pat. No. 11,612,067.

(60) Provisional application No. 63/197,847, filed on Jun. 7, 2021.

(30) Foreign Application Priority Data

Sep. 3, 2021    (CN) .......................... 202111030535.X

(51) Int. Cl.
*H05K 5/02*    (2006.01)

(52) U.S. Cl.
CPC .................................. *H05K 5/0217* (2013.01)

(58) Field of Classification Search
CPC .. H05K 7/1487; H05K 7/1411; H05K 7/1489; H05K 5/0217; H05K 5/0221
See application file for complete search history.

(56) References Cited

U.S. PATENT DOCUMENTS

| 7,214,088 | B1 | 5/2007 | Liang |
| 7,602,612 | B2 * | 10/2009 | Li ........................ H05K 5/0247 361/801 |

(Continued)

FOREIGN PATENT DOCUMENTS

| CN | 103941822 A | 7/2014 |
| CN | 103941822 B | 5/2017 |

(Continued)

*Primary Examiner* — Sagar Shrestha
(74) *Attorney, Agent, or Firm* — KIRTON McCONKIE; Evan R. Witt

(57) ABSTRACT

A device having fool-proofing structure is configured to be inserted into a cabinet along a first direction and includes a case and an elastic sheet module. The elastic sheet module is disposed on a side of the case and includes a first end disposed on the case, a second end opposite to the first end, a first protrusion portion and a second protrusion portion. The first protrusion portion is adjacent to the second end, protrudes from the case and is configured to abut against the cabinet. The second protrusion portion is farther from the second end than the first protrusion portion, protrudes from the case, and is configured to make the second end and the first protrusion portion move toward the interior of the case as being pressed by a force.

6 Claims, 5 Drawing Sheets

(56) References Cited

U.S. PATENT DOCUMENTS

| | | | |
|---|---|---|---|
| 8,208,261 B2 * | 6/2012 | Fan | G06F 1/188 312/223.1 |
| 8,611,099 B2 * | 12/2013 | Sun | H05K 7/1489 361/801 |
| 8,743,563 B2 * | 6/2014 | Liang | G06F 1/188 361/802 |
| 8,824,149 B2 * | 9/2014 | Wang | H05K 7/00 361/747 |
| 8,953,328 B2 * | 2/2015 | Lin | H05K 9/0018 361/801 |
| 9,170,620 B2 * | 10/2015 | Ma | G06F 1/188 |
| 9,210,828 B2 * | 12/2015 | Liao | H05K 5/023 |
| 9,265,181 B2 * | 2/2016 | Tang | H05K 7/20781 |
| 9,720,460 B2 * | 8/2017 | Ganta | H05K 5/0221 |
| 10,520,980 B2 * | 12/2019 | Hu | G06F 1/1632 |
| 11,425,838 B2 * | 8/2022 | Antaran | H05K 7/1411 |
| 2006/0250777 A1 * | 11/2006 | Chen | G06F 1/188 361/727 |
| 2008/0266817 A1 * | 10/2008 | Li | H05K 5/0247 361/747 |
| 2012/0293975 A1 * | 11/2012 | Liang | G06F 1/188 361/807 |
| 2013/0094156 A1 * | 4/2013 | Wang | G06F 1/188 361/747 |
| 2013/0176690 A1 * | 7/2013 | Sun | H05K 5/023 361/747 |
| 2013/0279123 A1 * | 10/2013 | Lin | H05K 7/1487 361/747 |
| 2013/0314865 A1 * | 11/2013 | Chuang | G06F 1/188 361/679.02 |
| 2015/0177802 A1 * | 6/2015 | Ma | H05K 7/1492 361/679.58 |
| 2015/0208544 A1 * | 7/2015 | Liao | H05K 7/1492 361/679.01 |
| 2022/0174837 A1 * | 6/2022 | Antaran | G06F 1/188 |

FOREIGN PATENT DOCUMENTS

| | | |
|---|---|---|
| CN | 207732184 U | 8/2018 |
| TW | I288989 B | 10/2007 |
| TW | 200843613 A | 11/2008 |
| TW | M610148 U | 4/2021 |

* cited by examiner

DEVICE HAVING FOOL-PROOFING STRUCTURE

CROSS-REFERENCE TO RELATED APPLICATION

This application is a Continuation Application of U.S. patent application Ser. No. 17/503,588 filed on Oct. 18, 2021, and entitled "DEVICE HAVING FOOL-PROOFING STRUCTURE AND CABINET TYPE DEVICE ASSEMBLY", which claims the benefit of U.S. Provisional Application Ser. No. 63/197,847 entitled "BUS BAR ASSEMBLY AND FOOL-PROOF LATCH STRUCTURE FOR POWER DISTRIBUTION SHELF", filed Jun. 7, 2021, and also claims priority to China Patent Application No. 202111030535.X, filed on Sep. 3, 2021. The entire contents of the above-mentioned applications are incorporated herein by reference for all purposes.

FIELD OF THE INVENTION

The present disclosure relates to a device having fool-proofing structure, and more particularly to a device having fool-proofing structure that the device is stopped from entering the cabinet and conditionally proceed owing to the structure of the elastic sheet.

BACKGROUND OF THE INVENTION

In a cabinet system, a power module is independently and correspondingly inserted into a slot of a cabinet. To prevent the power module from being inserted into the slot with a wrong size or in a wrong direction, it was common that the cabinet and the power module have matching structures for realizing the fool-proofing function. Currently, the fool-proofing function is realized by concave and convex structures. For example, a block is disposed on a side wall of the power module, and a recess or a hollowed groove matching for the block is formed on the partition of the slot. However, in the structure that the partition has the recess, owing to the recess, there is a bulge on the opposite side of the partition, which results in the limitation of the utilization of the neighboring space. On the other hand, in the structure that the partition has the hollowed groove, in order to realize the fool-proofing function at the beginning of inserting the power module and in consideration of the insertion process of the power module, the length of the hollowed groove is almost equal to the length of the power module. As a result, the structural strength of the cabinet is badly affected.

Therefore, there is a need of providing a device having fool-proofing structure so as to obviate the drawbacks encountered from the prior arts.

SUMMARY OF THE INVENTION

It is an object of the present disclosure to provide a device having fool-proofing structure for addressing the drawbacks of the prior art.

It is another object of the present disclosure to provide a device having fool-proofing structure. By a first protrusion portion and a second protrusion portion that are located on the front side and the rear side of an elastic sheet module, respectively, the device can be stopped from entering the cabinet and then proceed in certain condition. In addition, by disposing a notch that is corresponding to the first protrusion portion on a partition of the cabinet, the second protrusion portion can contact with the partition and make the first protrusion portion detached from the notch of the partition, so that the device can be rapidly installed in the cabinet with the fool-proofing function.

In accordance with an aspect of the present disclosure, there is provided a device having fool-proofing structure. The device having fool-proofing structure is configured to be inserted into a cabinet along a first direction and includes a case and an elastic sheet module. The elastic sheet module is disposed on a side of the case and includes a first end, a second end, a first protrusion portion and a second protrusion portion. The first end is disposed on the case. The second end is opposite to the first end. The first protrusion portion is adjacent to the second end, protrudes from the case and is configured to abut against the cabinet on the first direction. The second protrusion portion is disposed between the first end and the second end and is farther from the second end than the first protrusion portion. The second protrusion portion protrudes from the case and is configured to make the second end and the first protrusion portion move toward the interior of the case as being pressed by a force.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
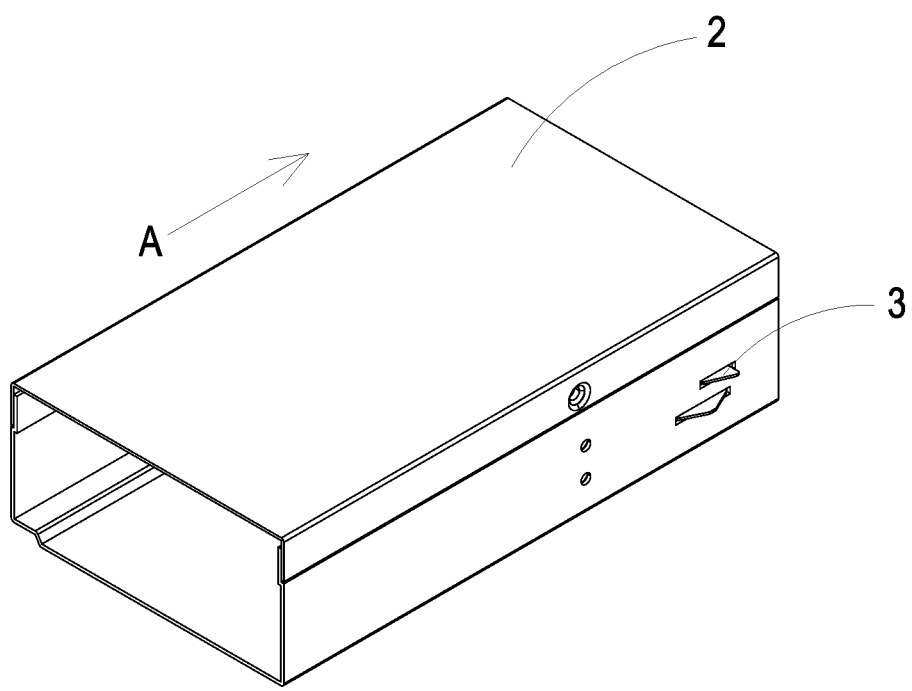
FIG. 1 is a schematic perspective view illustrating the electronic device according to an embodiment of the present disclosure.
Figure 2:
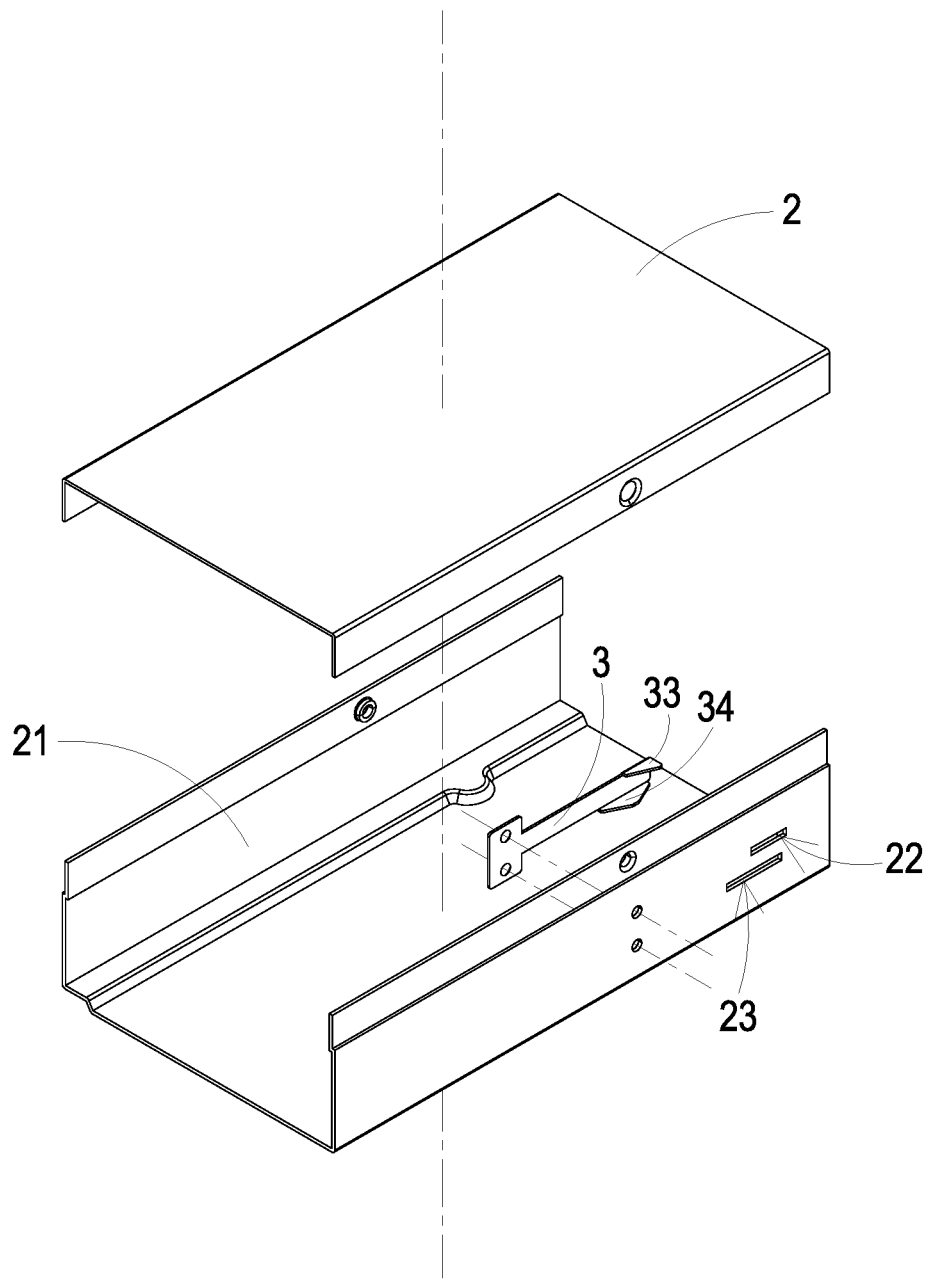
FIG. 2 is an exploded view illustrating the electronic device according to the embodiment of the present disclosure.
Figure 3A:
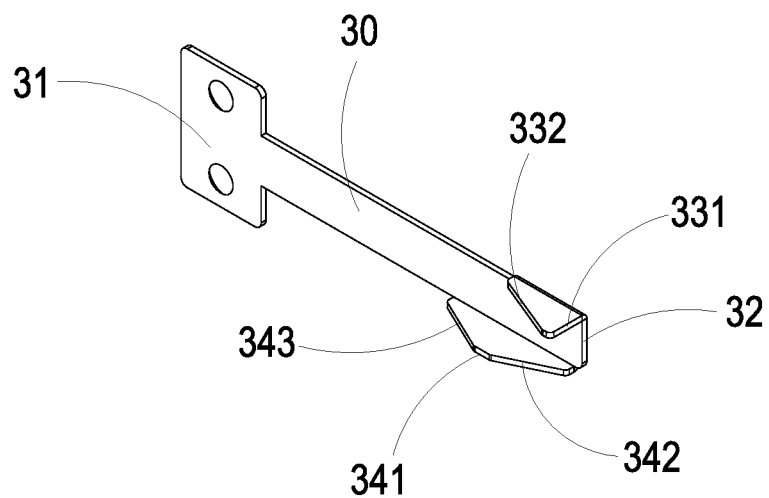
FIG. 3A is a schematic perspective view illustrating the elastic sheet module of FIG. 2 and taken from a different perspective.

Please refer to FIGS. 1, 2 and 3A. FIG. 1 is a schematic perspective view illustrating the electronic device according to an embodiment of the present disclosure. FIG. 2 is an exploded view illustrating the electronic device according to the embodiment of the present disclosure. FIG. 3A is a schematic perspective view illustrating the elastic sheet module of FIG. 2 and taken from a different perspective. In this embodiment, the device having fool-proofing structure is an electronic device 1. The device is represented by the electronic device 1 in following paragraphs. As shown in FIGS. 1, 2 and 3A, the electronic device 1 is configured to be inserted into a cabinet along a first direction A and includes a case 2 and an elastic sheet module 3. The elastic sheet module 3 is disposed on a side of the case 2 and includes a first end 31, a second end 32, a first protrusion portion 33 and a second protrusion portion 34. The first end 31 is disposed on the case 2. The second end 32 is opposite to the first end 31. In this embodiment, the first end 31 is located on the rear side of the first direction A, and the second end 32 is located on the front side of the first direction A. The first protrusion portion 33 is adjacent to the second end 32, protrudes from the case 2 and is configured to abut against the cabinet where the electronic device 1 is inserted into along the first direction A. The second protrusion portion 34 is disposed between the first end 31 and the second end 32, and is farther from the second end 32 than the first protrusion portion 33. The second protrusion portion 34 protrudes from the case 2 and is configured to make the second end 32 and the first protrusion portion 33 move toward the interior of the case 2 as being pressed by a force. In this embodiment, the case 2 includes an upper case and a lower case, and the first end 31 is fixed on the lower case by rivets or screws, but not limited thereto.

Please refer to FIG. 3A. In this embodiment, the elastic sheet module 3 is integrally formed of a metal sheet and includes a first surface 30. The first protrusion portion 33 and the second protrusion portion 34 are extended along a direction perpendicular to the first surface 30, but not limited thereto. In this embodiment, the first protrusion portion 33 includes a stopping portion 331. A surface of the stopping portion 331 is perpendicular to the first direction A, so that the stopping portion 331 is capable of abutting against the cabinet and stopping the movement of the electronic device 1, but not limited thereto. In some embodiments, the stopping portion 331 of the first protrusion portion 33 includes a slope or has a profile of hook, which is also capable of abutting against the cabinet and stopping the movement of the electronic device 1.

Figure 3B:
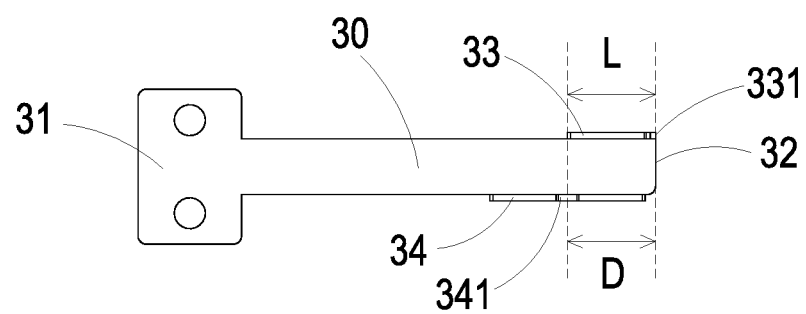
FIG. 3B is a side view illustrating the elastic sheet module of FIG. 2.

Please refer to FIGS. 3A and 3B. FIG. 3B is a side view illustrating the elastic sheet module of FIG. 2. In this embodiment, the surface of the stopping portion 331 of the first protrusion portion 33 is flush with the second end 32, but not limited thereto. The second protrusion portion 34 includes a top portion 341, and the top portion 341 and the stopping portion 331 of the first protrusion portion 33 have a distance D therebetween in the first direction A. When the second protrusion portion 34 is pressed toward the interior of the case 2, since the first end 31 of the elastic sheet module 3 is fixed on the case 2, the first protrusion portion 33 is farther from the first end 31, and the distance that the first protrusion portion 33 moves toward the interior of the case 2 is longer than the distance the second protrusion portion 34 moves, the first protrusion portion 33 is totally sunk into the interior of the case 2. Therefore, when the electronic device 1 is inserted into the cabinet, the first protrusion portion 33 located at the front side abuts against the cabinet and stops the electronic device 1 from moving forward. Next, by pressing the second protrusion portion 34 located on the rear side, the electronic device 1 is allowed to proceed into the cabinet.

Figure 4:
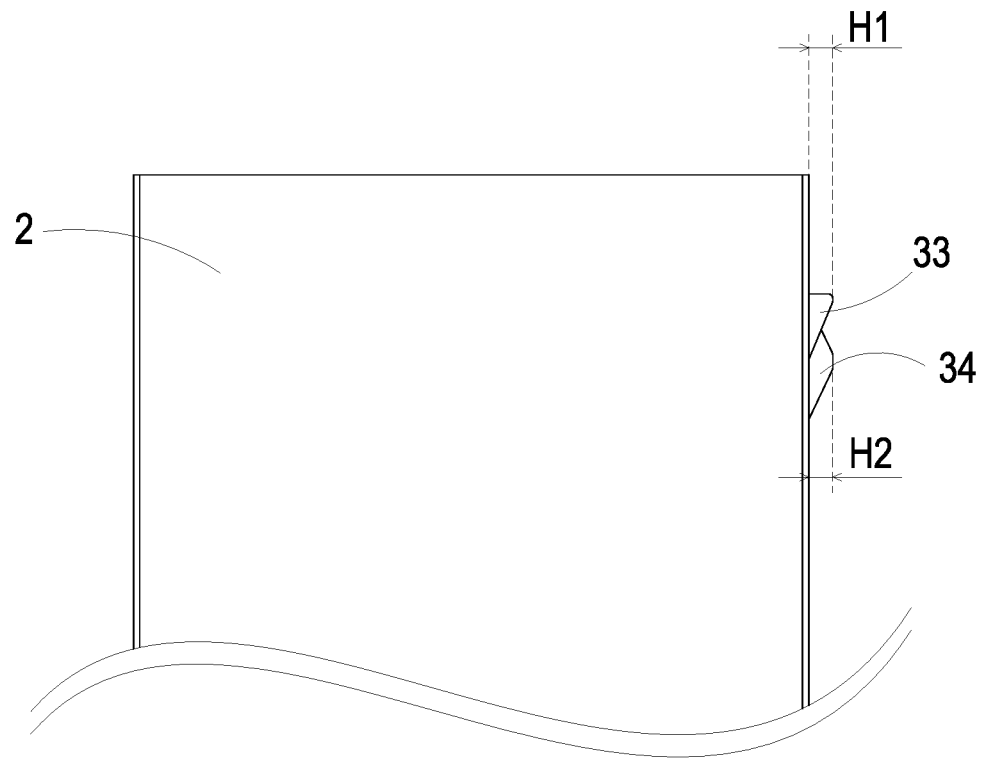
FIG. 4 is a top view illustrating the partial structure of electronic device of FIG. 1.

Please refer to FIGS. 2 and 4. FIG. 4 is a top view illustrating the partial structure of electronic device of FIG. 1. In this embodiment, the case 2 of the electronic device 1 includes an inner wall 21, a first opening 22 and a second opening 23. The first end 31 of the elastic sheet module 3 is fixed on the inner wall 21 of the case 2. The first protrusion portion 33 passes through and protrudes from the first opening 22 of the case 2. The second protrusion portion 34 passes through and protrudes from the second opening 23 of the case 2. In this embodiment, a height H1 of the first protrusion portion 33 protruding from the first opening 22 of the case 2 is in a range between 1.2 mm and 3.2 mm, and a height H2 of the second protrusion portion 34 protruding from the second opening 23 of the case 2 is in a range between 1.2 mm and 3.2 mm. In this embodiment, the height H1 of the first protrusion portion 33 is slightly higher than the height H2 of the second protrusion portion 34, but not limited thereto. It should be noted that the heights H1 and H2 of the first protrusion portion 33 and the second protrusion portion 34 can be individually adjusted according to the distance D between the first protrusion portion 33 and the second protrusion portion 34, the thickness of the case 2, the gap between the electronic device 1 and the cabinet, and the thickness of the partition inside the cabinet.

Figure 5:
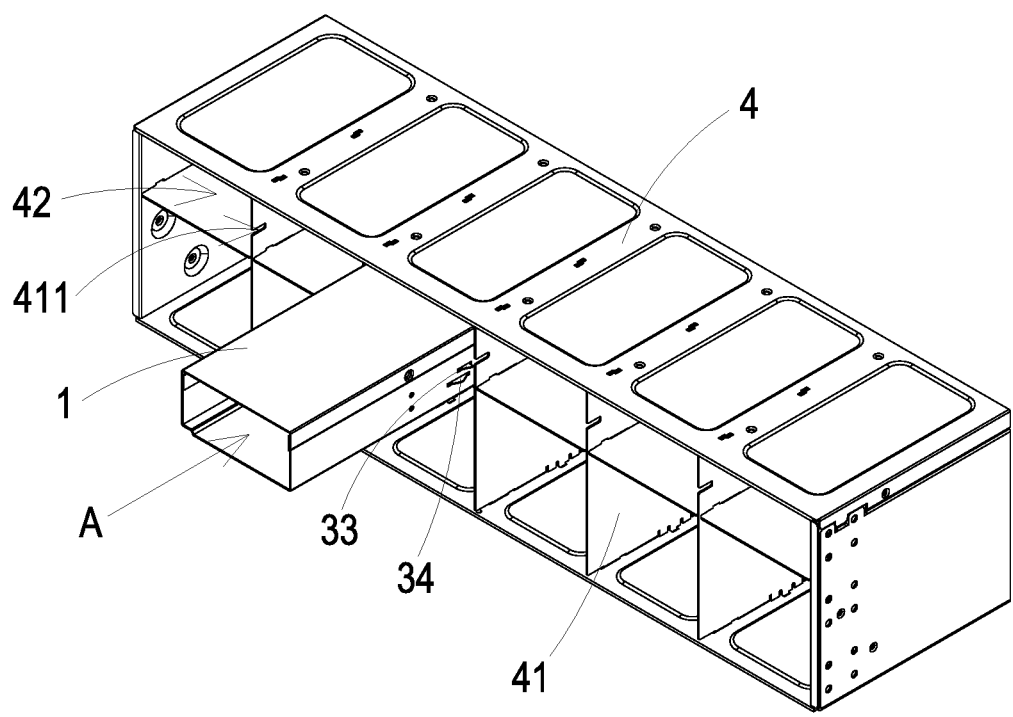
FIG. 5 is a schematic perspective view illustrating the cabinet type device assembly according to an embodiment of the present disclosure.

Please refer to FIG. 5. FIG. 5 is a schematic perspective view illustrating the cabinet type device assembly according to an embodiment of the present disclosure. As shown in FIG. 5, the electronic device 1 described above can be assembled with a cabinet 4 so as to form a cabinet type device assembly 5. The cabinet 4 includes at least one partition 41 and at least one slot 42. The partition 41 includes at least one notch 411, and the notch 411 is correspondingly disposed on a side of the slot 42. The electronic device 1 is disposed in the slot 42. The first protrusion portion 33 of the elastic sheet module 3 of the electronic device 1 and the notch 411 on the side of the slot 42 are corresponding to each other in height. When the electronic device 1 is inserted into the slot 42 of the cabinet 4 along the first direction A, the first protrusion portion 33 is correspondingly accommodated in the notch 411 of the partition 41. Thereafter, when the second protrusion portion 34 is in contact with the partition 41 of the cabinet 4 and makes the second end 32 and the first protrusion portion 33 move toward the interior of the case 2, the first protrusion portion 33 is detached from the notch 411 of the partition 41, so that the electronic device 1 can be totally inserted into the slot 42 of the cabinet 4. In this embodiment, the electronic device 1 is a power module, but not limited thereto.

Please refer to FIGS. 3A and 5. In this embodiment, the second protrusion portion 34 includes the top portion 341 and a first extension portion 342. The top portion 341 is the highest portion of the second protrusion portion 34. The first extension portion 342 includes a slope, is connected to the top portion 341 and is closer to the second end 32 than the top portion 341. When the electronic device 1 is inserted into the slot 42 of the cabinet 4 in a correct way, since the first protrusion portion 33 of the elastic sheet module 3 is correspondingly accommodated in the notch 411 of the partition 41, the second protrusion portion 34 is capable of directly contacting with the partition 41. Thereafter, the partition 41 is in contact with the second protrusion portion 34 along the slope of the first extension portion 342 to gradually press the second protrusion portion 34 into the interior of the case 2, and is finally in contact with the top portion 341 of the second protrusion portion 34. Meanwhile, owing to the contact between the second protrusion portion 34 and the partition 41, the first protrusion portion 33 is sunk into the case 2 and is totally detached from the notch 411 of the partition 41, so as to allow the electronic device 1 to proceed into the slot 42. Therefore, when the electronic device 1 is inserted into the slot 42 in the correct way, owing to the first extension portion 342 of the second protrusion portion 34, the first protrusion portion 33 can be automatically detached from the notch 411 during the process of inserting the electronic device 1. Consequently, the electronic device 1 can be installed into the cabinet 4, rapidly and conveniently.

In this embodiment, when the electronic device 1 is inserted into the slot 42 of the cabinet 4 in a wrong way, which means the first protrusion portion 33 of the elastic sheet module 3 is not corresponding to the notch 411 of the partition 41, the second protrusion portion 34 cannot contact with the partition 41 to make the first protrusion portion 33 sunk into the case 2. As a result, the electronic device 1 is stopped from entering the slot 42 since the first protrusion portion 33 abuts against the partition 41. Therefore, by the arrangement of the first protrusion portion 33 and the second protrusion portion 34 of the elastic sheet module 3 and the notch 411 of the cabinet 4, the electronic device 1 is prevented from being inserted into the slot 42 in the wrong way. Consequently, the fool-proofing function is effectively realized.

Furthermore, in this embodiment, the second protrusion portion 34 further includes a second extension portion 343. The second extension portion 343 includes a slope. The first extension portion 342 and the second extension portion 343 are symmetrical and disposed on two opposite sides of the top portion 341, respectively. In this embodiment, the first protrusion portion 33 further includes a third extension portion 332, and the third extension portion 332 also includes a slope. The slope of the third extension portion 332 of the first protrusion portion 33 is parallel to the slope of the second extension portion 343 of the second protrusion portion 34, but not limited thereto. In this embodiment, the first protrusion portion 33 has a profile of a right triangle, and the second protrusion portion 34 has a profile of an isosceles triangle, but not limited thereto. In some embodiments, the first protrusion portion 33 has a profile similar to a sector, and the second protrusion portion 34 has a profile of a semicircle. That is, the profiles of the first extension portion 342 and the second extension portion 343 of the second protrusion portion 34 and the third extension portion 332 of the first protrusion portion 33 are arcs. Consequently, the structural strength of the elastic sheet module 3 is enhanced. The first protrusion portion 33 and the second protrusion portion 34 are prevented from damage resulting from colliding with the partition 41. In addition, the manufacturing cost of the elastic sheet module 3 can be reduced.

Please refer to FIG. 5. In this embodiment, the cabinet type device assembly 5 includes a plurality of electronic devices 1. The cabinet 4 includes a plurality of partitions 41 and a plurality of slots 42. One of the electronic devices 1 is adjacent to another electronic device 1 by the side of the case 2 where the elastic sheet module 3 is disposed. It should be noted that since the elastic sheet module 3 can be sunk into the interior of the case 2, the problem of reducing the utilization of the neighboring space, which is due to the recess of the prior art, is addressed. Furthermore, the influence on the structural strength of the cabinet can also be reduced. Consequently, the electronic devices 1 can be stacked vertically or be arranged side-by-side in the cabinet 4 without affecting the space utilization and the structural strength of the cabinet 4.

Please refer to FIGS. 3B and 5. In this embodiment, the stopping portion 331 is configured to abut against the partition 41. Accordingly, a length of the notch 411 of the partition 41 is larger than or equal to the distance D between the top portion 341 of the second protrusion portion 34 and the stopping portion 331 of the first protrusion portion 33 of the electronic device 1. Therefore, the first protrusion portion 33 can be sunk into the interior of the case 2 before contacting with the partition 41. In addition, a length L of the first protrusion portion 33 is equal to the distance D between the top portion 341 of the second protrusion portion 34 and the stopping portion 331 of the first protrusion portion 33, but not limited thereto. In this embodiment, a distance between the notch 411 and a top surface of the slot 42 is unequal to a distance between the notch 411 and a bottom surface of the slot 42. In other words, the notch 411 is not disposed at a middle height of the slot 42. Thereby, the electronic device 1 is prevented from being inserted into the slot 42 of the cabinet 4 in an upside-down way.

From the above descriptions, the present disclosure provides a device having fool-proofing structure and a cabinet type device assembly. By the first protrusion portion and the second protrusion portion, which are located on the front side and the rear side of the elastic sheet module, respectively, the device can be stopped from entering the cabinet and then proceed as the second protrusion portion is pressed. On the other hand, by the notch of the cabinet which is corresponding to the first protrusion portion, the second protrusion portion can directly contact with the partition and make the first protrusion portion detached from the notch of the partition, so that the device can be quickly installed into the cabinet in the correct way. Furthermore, owing to the elastic sheet module of the device, it is beneficial to arrange the devices side-by-side without reducing the space utilization and the structural strength of the cabinet.

While the disclosure has been described in terms of what is presently considered to be the most practical and preferred embodiments, it is to be understood that the disclosure needs not be limited to the disclosed embodiment.

What is claimed is:

1. A device having fool-proofing structure arranged to be inserted into a cabinet along a first direction and comprising a case and an elastic sheet module, wherein the elastic sheet module is disposed on a side of the case and comprises:
   a first end disposed on the case;
   a second end opposite to the first end;
   a first protrusion portion comprising a stopping portion, wherein the first protrusion portion is adjacent to the second end, and protrudes from the case and abuts against the cabinet on the first direction; and
   a second protrusion portion comprising a top portion, a first extension portion and a second extension portion, wherein the first extension portion and the second extension portion are disposed on two opposite sides of the top portion and respectively includes a slope connecting to the top portion, and the top portion of the second protrusion portion and the stopping portion of the first protrusion portion have a distance therebetween in the first direction, and the second protrusion portion is disposed between the first end and the second end and farther from the second end than the first protrusion portion, and protrudes from the case, when the second protrusion portion is pressed by a force, the second end and the first protrusion portion move toward the interior of the case.

2. The device having fool-proofing structure according to claim 1, wherein a surface of the stopping portion is perpendicular to the first direction.

3. The device having fool-proofing structure according to claim 2, wherein the surface of the stopping portion of the first protrusion portion is flush with the second end.

4. The device having fool-proofing structure according to claim 1, wherein the elastic sheet module is integrally formed of a metal sheet.

5. The device having fool-proofing structure according to claim 1, wherein the case comprises an inner wall, a first opening and a second opening, wherein the first end of the elastic sheet module is fixed on the inner wall of the case, the first protrusion portion passes through and protrudes from the first opening of the case, and the second protrusion portion passes through and protrudes from the second opening of the case.

6. The device having fool-proofing structure according to claim 1, wherein a height of the first protrusion portion protruding from the case is in a range between 1.2 mm and 3.2 mm, and a height of the second protrusion portion protruding from the case is in a range between 1.2 mm and 3.2 mm.

* * * * *